United States Patent
Gao

(10) Patent No.: US 6,603,597 B2
(45) Date of Patent: Aug. 5, 2003

(54) DUAL MODE PROGRAMMABLE OPTICAL LOGARITHMIC AMPLIFIER DRIVER

(75) Inventor: Renyuan Gao, Strafford, PA (US)

(73) Assignee: Photon-X, Inc., Malvern, PA (US)

( * ) Notice: Subject to any disclaimer, the term of this patent is extended or adjusted under 35 U.S.C. 154(b) by 70 days.

(21) Appl. No.: 09/877,946

(22) Filed: Jun. 8, 2001

(65) Prior Publication Data

US 2002/0186728 A1 Dec. 12, 2002

(51) Int. Cl.$^7$ .................................................. H01S 3/00
(52) U.S. Cl. ................................. 359/341.4; 372/38.07
(58) Field of Search ........................ 359/341.4, 341.41; 372/38.02, 38.07, 29.015

(56) References Cited

U.S. PATENT DOCUMENTS

| | | |
|---|---|---|
| 5,659,558 A | 8/1997 | Tohmon et al. |
| 5,793,512 A | 8/1998 | Ryu |
| 5,822,113 A | 10/1998 | Delavaux et al. |
| 5,861,981 A | 1/1999 | Jabr |
| 5,940,209 A | 8/1999 | Nguyen |
| 6,118,576 A | 9/2000 | Sugiya et al. |
| 6,151,157 A | 11/2000 | Ball et al. |
| 6,151,159 A | 11/2000 | Michishita |
| 6,198,571 B1 | 3/2001 | Yang |
| 6,204,945 B1 | 3/2001 | Iwata et al. |
| 6,246,514 B1 * | 6/2001 | Bonnedal et al. ........... 359/341 |

* cited by examiner

Primary Examiner—Mark Hellner
(74) Attorney, Agent, or Firm—Joseph E. Maenner; Monte & McGraw, PC

(57) ABSTRACT

A dual mode electronic amplifier controller is disclosed. The amplifier includes a first amplifier electronically connectable to an optical input signal and a second amplifier electronically connectable to an optical output signal. The first amplifier has a first output and the second amplifier has a second output. The amplifier controller further includes a microprocessor electronically connected to the first and second outputs. The microprocessor is adapted to operate in one of a first mode wherein the microprocessor compares functions of the first and second outputs and generates a first microprocessor output, and a second mode wherein the microprocessor compares the second output to a predetermined value and generates a second microprocessor output, such that, in either the first or second modes, each of the first and second microprocessor outputs is adapted to adjust electrical current to a laser.

15 Claims, 5 Drawing Sheets

DUAL MODE PROGRAMMABLE OPTICAL LOGARITHMIC AMPLIFIER DRIVER

STATEMENT REGARDING FEDERALLY FUNDED SPONSORED RESEARCH OR DEVELOPMENT

The U.S. Government has a paid-up license in this invention and the right in limited circumstances to require the patent owner to license others on reasonable terms as provided for by the terms of Contract No. N00014-00-C-0117 awarded by the Department of the Navy.

FIELD OF THE INVENTION

The present invention relates to electronic controllers for laser optical amplifiers, specifically, controllers having logarithmic amplifiers.

BACKGROUND OF THE INVENTION

Rare earth doped optical amplifiers have emerged as the predominant optical signal amplification device in nearly every aspect of optical communication networks spanning from repeaters, pre-amplifiers and power boosters to wavelength division multiplexed (WDM) systems. These amplifiers are suitable for terrestrial, transoceanic, metro/access, cable television, and local area networks. The optical amplifier boosts the optical signal directly in the optical domain without the need for converting the signal into an electrical signal. As modern telecommunication networks increasingly require robustness, flexibility, reconfigurability, and reliability, there is an ever-growing demand for automatically controlled optical amplifier devices.

In reconfigurable dense wavelength multiplexed (DWDM) systems with optical add-drop multiplexing (OADM), the input signal power undergoes variations as the channel configurations or the operation conditions change. It would be beneficial to provide a stabilized optical amplifier device that automatically adjusts its signal gain, or its signal output power. Furthermore, it would be beneficial to have an optical amplifier which can be dynamically controlled and adjusted by a central system via a standard communication port.

Laser diode driver circuits are required in optical telecommunication systems. Such circuits have been widely implemented in current optical systems primarily in two cases: (1) to drive optical signal transmitter lasers, such as distributed feedback (DFB) lasers and tunable laser diodes (TLD); and (2) to drive 980 nanometer or 1480 nanometer pump laser diodes for optical amplifiers, including erbium doped fiber amplifiers (EDFA) and Raman amplifiers.

Most of the currently deployed pump laser diodes and associated laser diode driver circuits are non-controllable. With increasing awareness of the importance of more reliable and more resilient optical networks, there have been efforts to develop controllable and programmable laser diode drivers, examples of which are shown in U.S. Pat. Nos. 5,604,757; 5,802,089; 5,675,600; and 6,055,252. While the laser diode controllers disclosed in these patents are controllable and offer improved performance and stability over non-controllable laser diodes, none of the controllers described therein are designed specifically for advanced optical amplifier applications. To implement such a dynamically controlled optical amplifier design, it would be beneficial to provide an electronic driver circuit that provides to the pump laser diode an adjustable driver current and that monitors the optical amplifier input and output signals.

Further, known electronic driver circuits provide one of gain clamping and output power clamping. It would be beneficial to provide an electronic driver circuit that can alternately provide both gain clamping and output power clamping.

BRIEF SUMMARY OF THE INVENTION

Briefly, the present invention provides a dual mode electronic amplifier controller. The controller comprises a first amplifier electronically connectable to an optical input signal and a second amplifier electronically connectable to an optical output signal. The first amplifier has a first output and the second amplifier has a second output. The amplifier controller also comprises a microprocessor electronically connected to the first and second outputs. The microprocessor is adapted to operate in one of a first mode wherein the microprocessor compares functions of the first and second outputs and generates a first microprocessor output, and a second mode wherein the microprocessor compares the second output to a predetermined value and generates a second microprocessor output, such that, in either the first or second modes, each of the first and second microprocessor outputs is adapted to adjust electrical current to a laser.

BRIEF DESCRIPTION OF THE DRAWINGS

The accompanying drawings, which are incorporated herein and constitute part of this specification, illustrate the presently preferred embodiment of the invention, and, together with the general description given above and the detailed description given below, serve to explain the features of the invention. In the drawings.

DETAILED DESCRIPTION OF THE INVENTION

Figure 1:
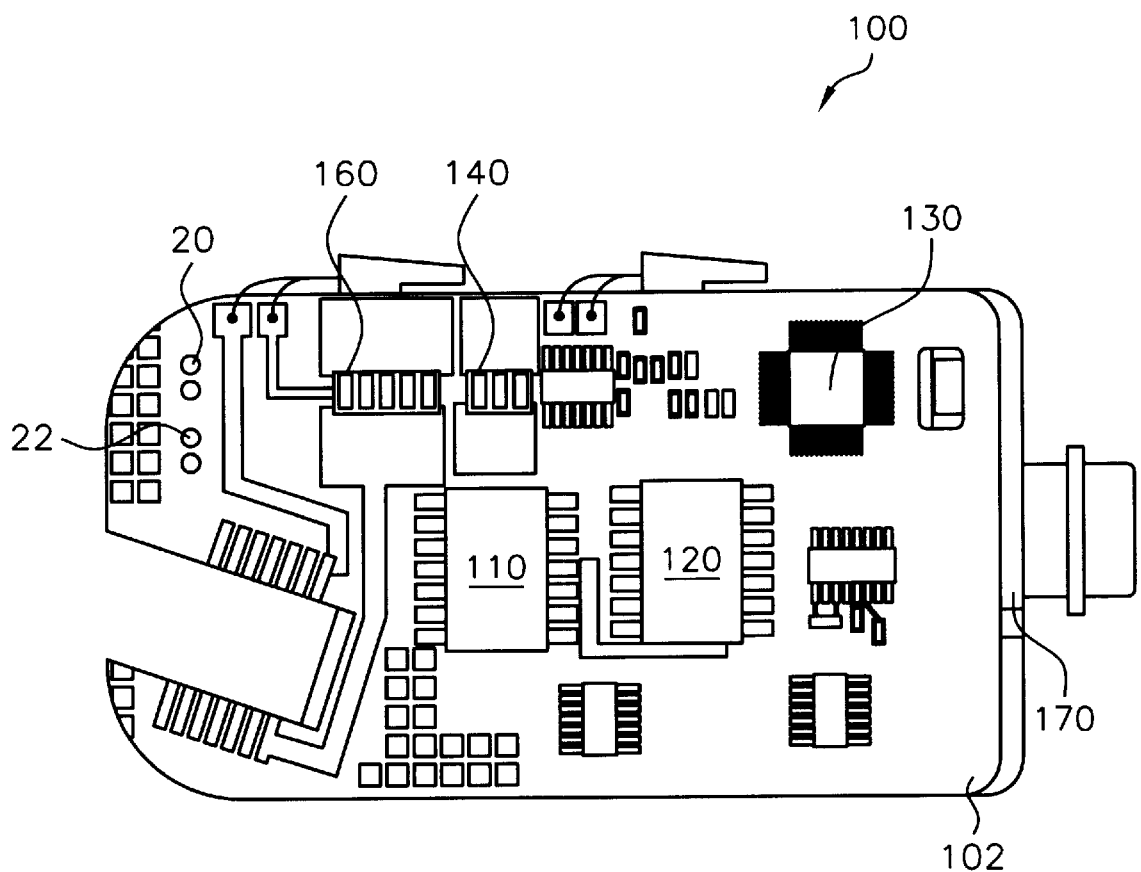
FIG. 1 is a plan view of a dual mode electronic amplifier controller according to the present invention.

In the drawings, like numerals indicate like elements throughout. A dual mode electronic amplifier controller (hereinafter "controller") 100 is used in an optical amplifier (not shown) to control the amount of current provided to a pump laser (not shown) in the optical amplifier. Such an optical amplifier is disclosed in U.S. patent application Ser. No. 09/877,760, filed on even date, which is owned by the assignee of the present invention and is incorporated herein by reference in its entirety. As shown in FIG. 1, the controller 100 is preferably disposed on a printed circuit board 102 having approximate dimension of 6.1 mm×11.3 mm.

Figures 2, 2A:
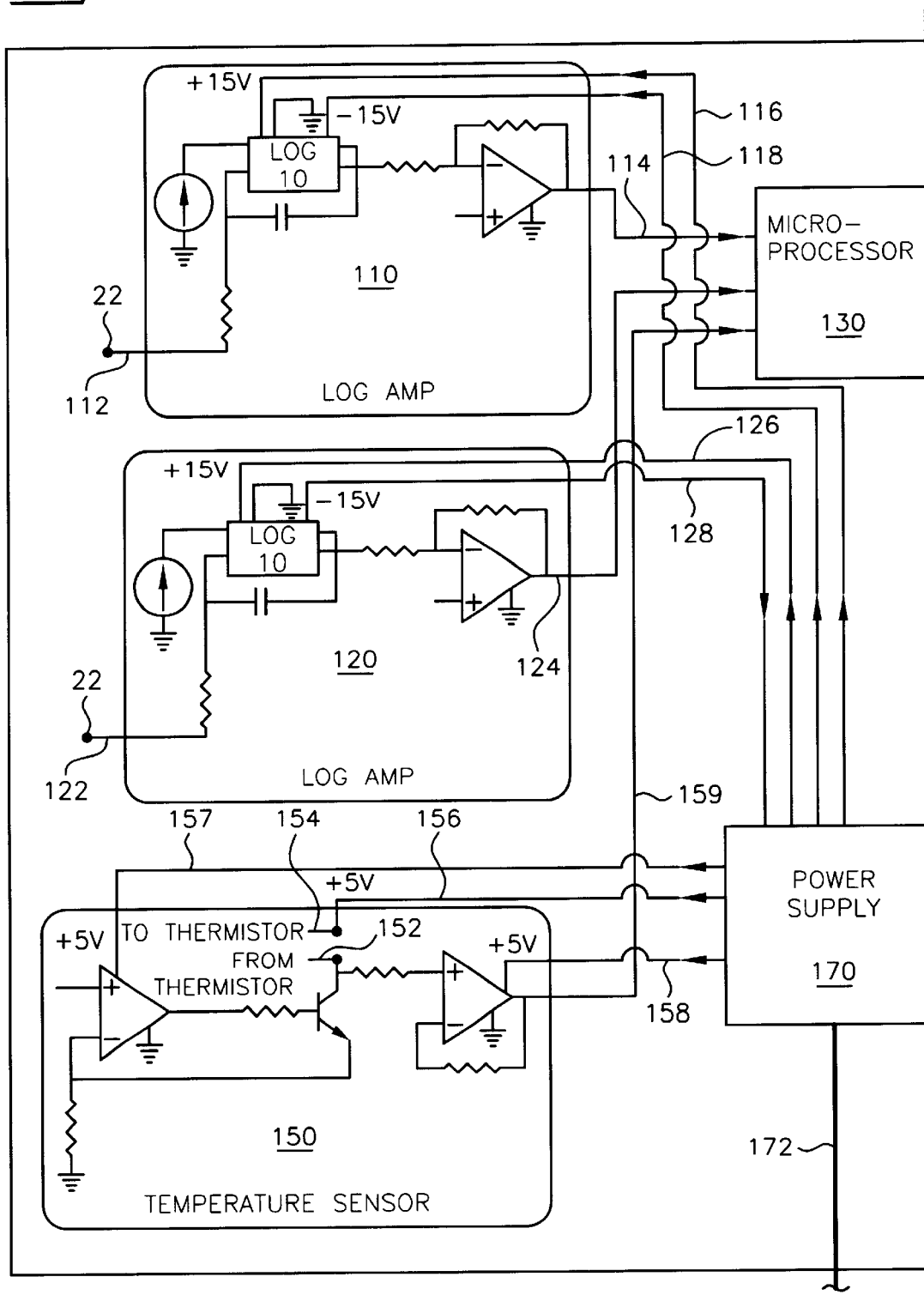
FIG. 2 is a schematic diagram of the dual mode electronic amplifier controller according to the present invention.
Figure 2B:
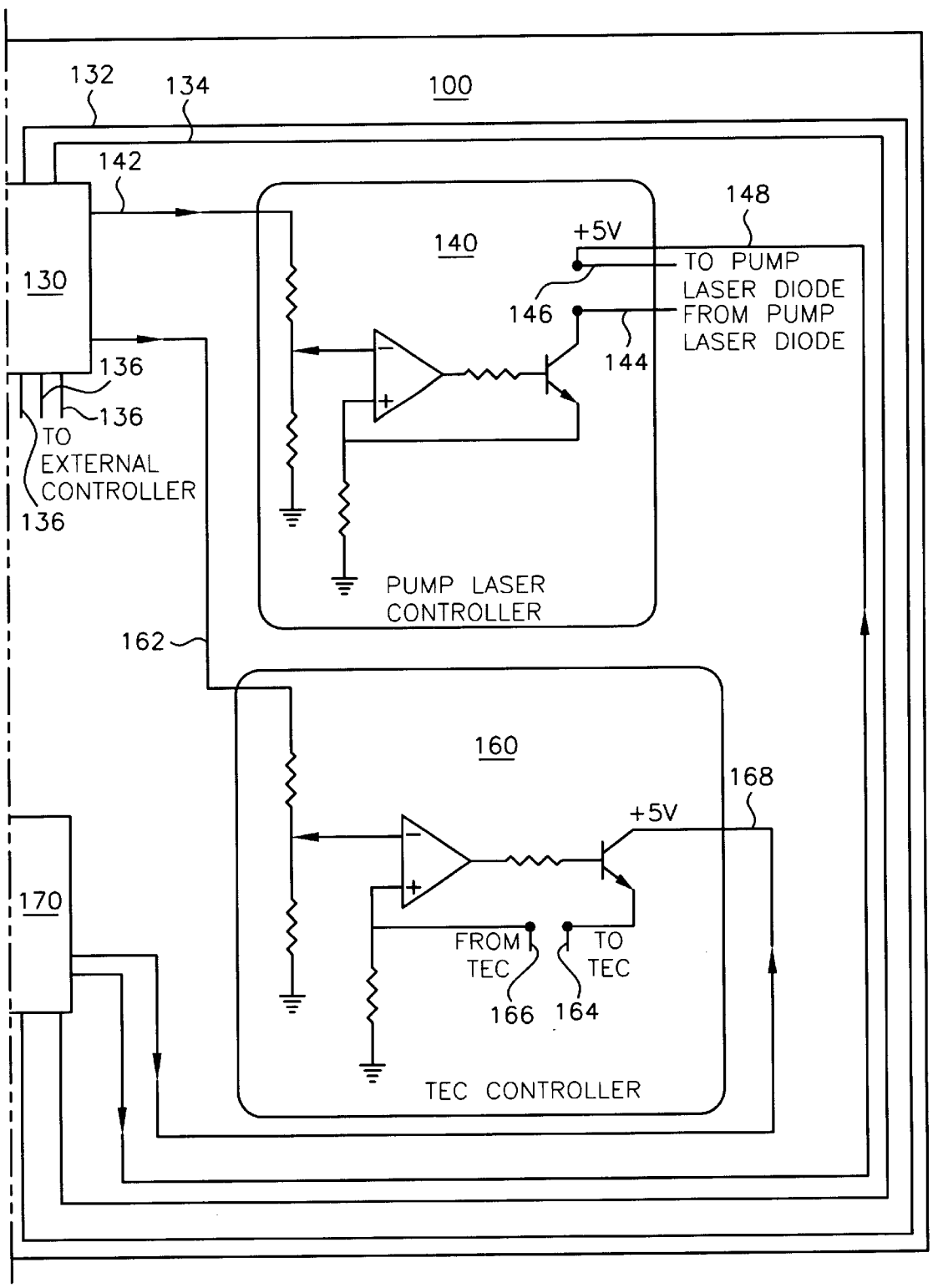

Referring to FIG. 2, the controller 100 includes a first, or input logarithmic amplifier (log amp) 110, a second or output logarithmic amplifier (hereinafter "log amp") 120, a microprocessor 130, a pump laser controller 140, a temperature sensor 150, a thermoelectric cooler (TEC) controller 160, and a power supply connection 170.

A first signal input 112, electronically connects the input of the first log amp 110 to a first photodetector 20. The first signal input 112 taps a percentage of a preamplified input light signal, preferably approximately one percent, which is converted to a digital electronic signal, and transmits the tapped input light signal to the log amp 110. A first signal output 114 electronically connects the output of the first log amp 110 to the microprocessor 130. The first log amp 110 is electrically connected to the power supply 170 by first log amp power connections 116, 118.

A second signal input 122, electronically connects the input of the second log amp 120 to a second photodetector 22. The second signal input 122 taps a percentage of an amplified output light signal, preferably approximately one percent, which is converted to a digital electronic signal, and transmits the tapped output light signal to the log amp 120. A second signal output 124 electronically connects the output of the second log amp 120 to the microprocessor 130. The second log amp 120 is electrically connected to the power supply 170 by second log amp power connections 126, 128. Preferably, each of the first and second log amps 110, 120 has a dynamic range between 50 and 100 dB.

The microprocessor 130 includes power supply connections 132, 134 to the power supply 170. The power supply connections 132, 134 provide electrical power to the microprocessor 130 from the power supply 170. The microprocessor 130 also includes external controller connections 136 to an external controller. The external controller connections 136 can be in the form of an RS-232 connection, a General Purpose Interface Board (GPIB) transceiver, or other connection.

The laser controller 140 includes a microprocessor connection 142 which electronically connects the microprocessor 130 to the laser controller 140, through which the microprocessor 130 transmits current control signals to the laser controller 140. The laser controller 140 also includes a pump laser diode input connection 144 and a pump laser diode connection 144 which electronically connect the laser controller 140 to a pump laser diode in the pump laser (not shown) to provide varying current to the pump laser diode, thereby controlling the output power of the pump laser diode. The laser controller 140 further includes a power supply connection 148, which electrically connects the laser controller 140 to the power supply 170.

The temperature sensor 150 includes a first thermistor connection 152 and a second thermistor connection 154, which are electronically connected to a thermistor on the pump laser (not shown). The temperature sensor 150 also includes a first power connection 156, which is electronically connected to the power supply 170 at the second thermistor connection 154. The power supply 170 provides power to the thermistor through the second thermistor connection 154. The temperature sensor 150 also includes second and third power connections 157, 158, respectively, which provide power to the temperature sensor 150 from the power supply 170. The temperature sensor 150 also includes an output connection 159 to the microprocessor 130.

The TEC controller 160 includes a signal input connection 162, which is electronically connected to the microprocessor 130, to receive an electronic signal from the microprocessor 130. The TEC controller 160 includes TEC connections 164, 166 for a TEC located in the pump laser, as well as a power supply connection 168 to the power supply 170.

The temperature sensor 150 and the TEC controller 160, with the microprocessor 130, are adapted to control the temperature of the pump laser via a feedback loop. The temperature sensor 150 receives a temperature signal from the pump laser through the first and second thermistor connections 152, 154 and transmits a signal to the microprocessor 130 through the output connection 159. The microprocessor 130 then transmits a signal to the TEC controller 160 through the signal input connection 162. The TEC controller 160 then transmits a signal to the TEC on the pump laser through the TEC connections 164, 166. The TEC regulates the temperature of the pump laser based on the signal transmitted by the TEC controller 160.

The power supply 170 includes a power connection 172 for power input from an outside power source. Preferably, the power connection 172 can be provided through an RS-232 connection which also provides control signals to the microprocessor 130.

As shown in FIG. 2, a plurality of resistors R are illustrated in the schematics for the first log amp 110, the second log amp 120, the pump laser controller 140, the temperature sensor 150, and the thermoelectric cooler (TEC) controller 160. Those skilled in the art will recognize that the resistors shown can all have the same value, or, more likely, several different values, desired values of which can be determined without undue experimentation in order to obtain desired operating parameters of the controller 100.

Although not shown, those skilled in the art will recognize that connections which connect the first log amp 110, the second log amp 120, the pump laser controller 140, the temperature sensor 150, and the thermoelectric cooler (TEC) controller 160 to the microprocessor 130 can include resistors, capacitors, and other electronic devices as required to provide desired operational parameters of the controller 100.

The controller 100 is configured to operate in two modes. The modes are selected and can be alternated by commands from an external controller (not shown), which is electronically connected to the microprocessor 150 via the external controller connection 136.

Figure 3:
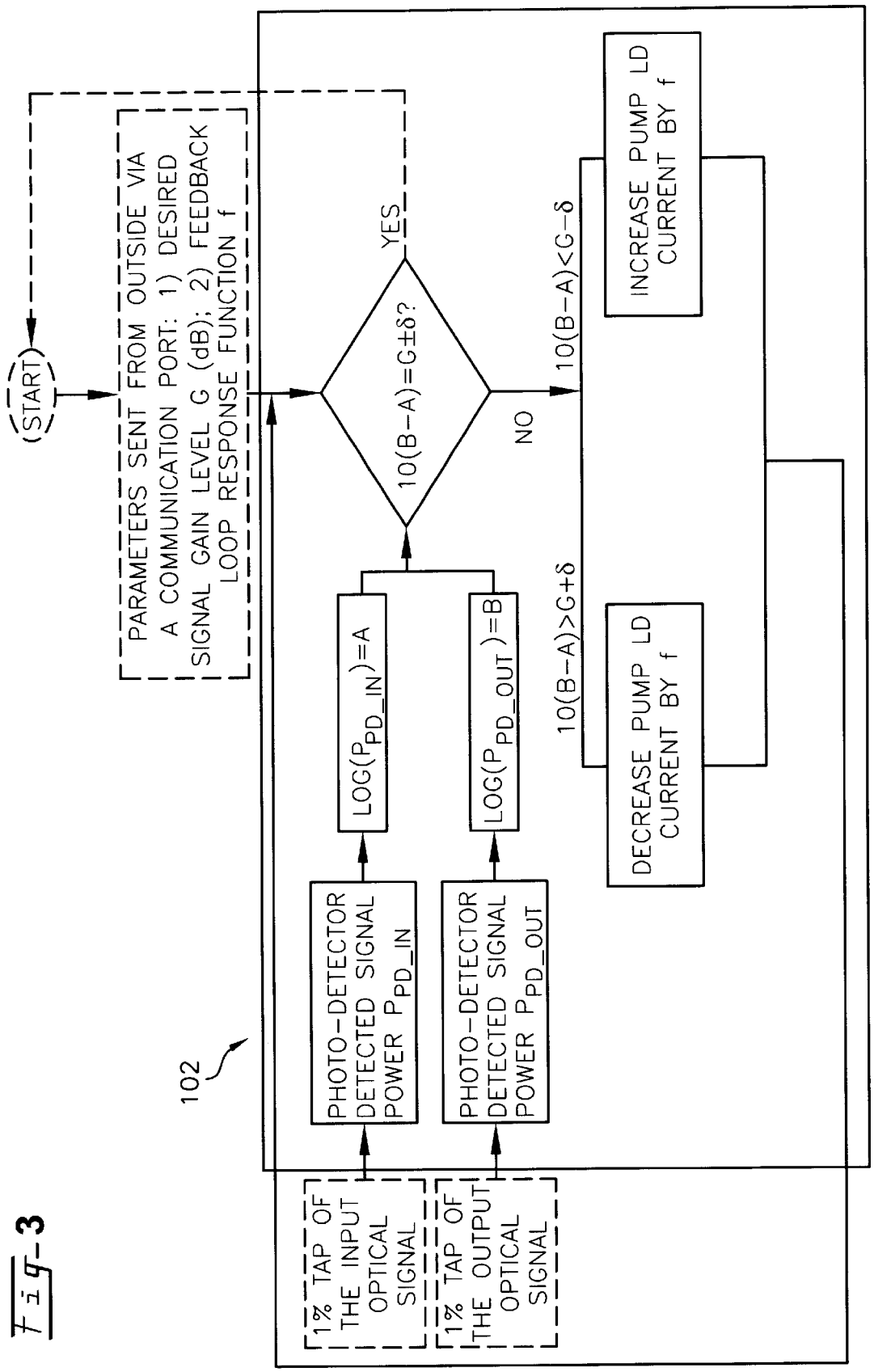
FIG. 3 is a flowchart showing operation of the dual mode electronic amplifier controller in a first mode.

A first mode is shown in a flow chart in FIG. 3. Flowchart operations which take place within the controller 100 are included within the heavy solid box. In the first mode, the external controller adjustably provides parameters to the microprocessor 130 through the external controller connection 136, such as desired signal gain level "G", in decibels (dB), and the value of a feedback loop response function "f", in milliamps. The controller 100 accepts the tapped, preamplified input light signal from the input photodetector 20 as well as the tapped, amplified output light signal from the output photodetector 22. The tapped, preamplified input signal is converted to an analog electronic input signal $P_{PD\_IN}$ and transmitted to the first log amp 110 and the tapped, amplified output signal is converted to an analog electronic output signal $P_{PD\_OUT}$ and transmitted to the second log amp 120.

The first log amp 110 takes the base 10 logarithm of the analog electronic input signal $P_{PD\_IN}$, and generates a first logarithmic output "A". Similarly, the second log amp takes the base 10 logarithm of the analog electronic output signal $P_{PD\_OUT}$ and generates a second logarithmic output "B". The first and second logarithmic outputs A, B are sent to the microprocessor 130. The microprocessor 130 takes the difference of the second and first logarithmic outputs (B−A) and multiplies them by a factor, such as 10, to obtain a result "C". The microprocessor 130 then compares the result C to the value of the desired signal gain level G±a predetermined delta δ. If C is within the range of G±δ, then no adjustments are required. If, however, C is outside the range of G±δ, then the microprocessor 130 sends a signal through the pump laser diode input connections 144, 146 to the pump laser controller 140 to increase or decrease current to the pump laser diode by f milliamps. An increase in current to the pump laser diode will increase amplification of the signal light, thus increasing the value of the second logarithmic output B. Correspondingly, a decrease in current to the pump laser diode will decrease amplification of the signal light, thus decreasing the value of the second logarithmic output B.

The controller 100 is part of a feedback loop within the optical amplifier to receive and process the electronic input signal $P_{PD\_IN}$ and the electronic output signal $P_{PD\_OUT}$ to control the desired gain level G. The function of the electronic input signal $P_{PD\_IN}$ and the electronic output signal $P_{PD\_OUT}$ are processed by the microprocessor 150 periodically, preferably between a range of approximately 0.1 milliseconds to 100 milliseconds.

Figure 4:
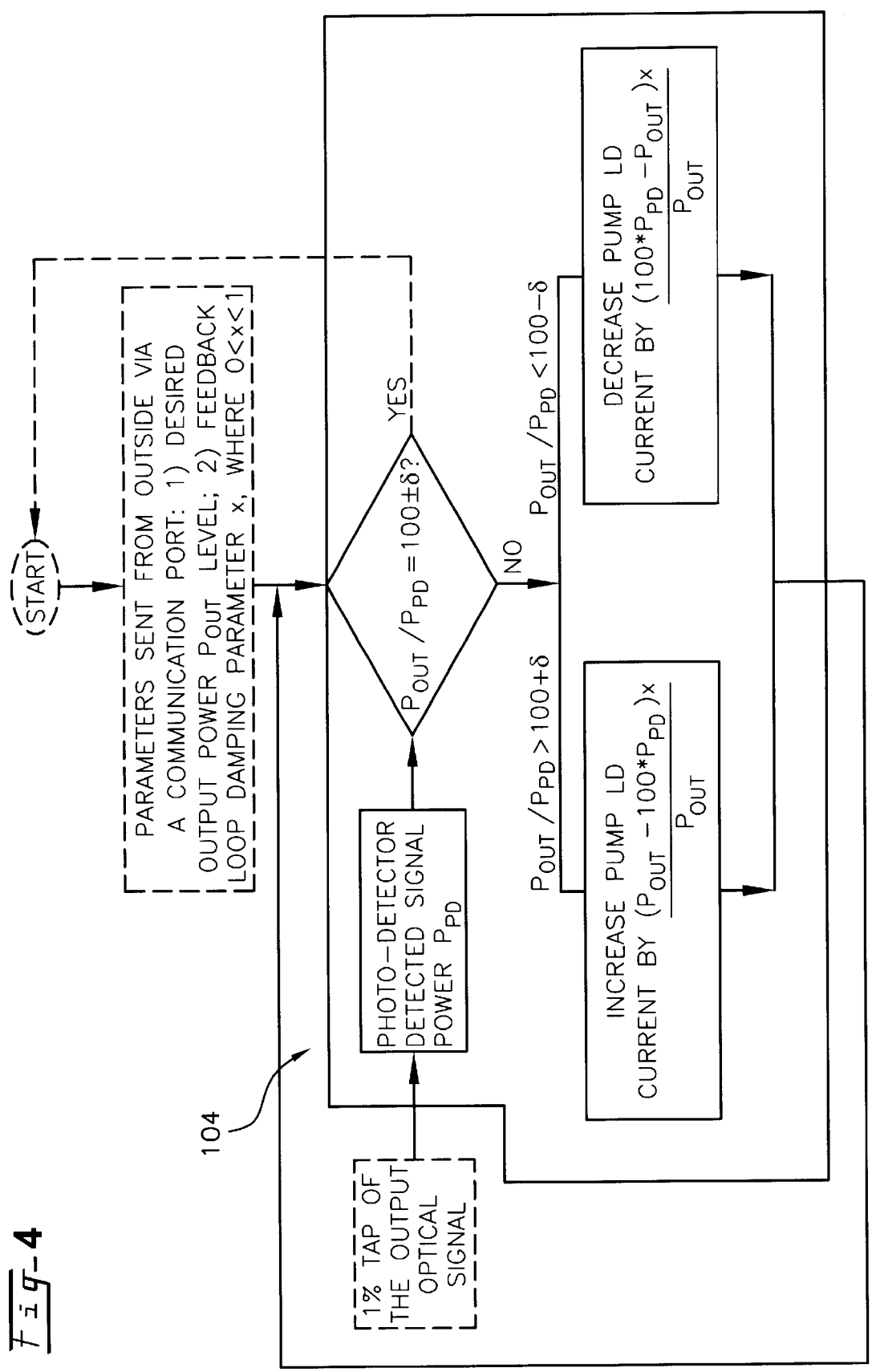
FIG. 4 is a flowchart showing operation of the dual mode electronic amplifier controller in a second mode.

A second mode is shown in a flow chart in FIG. 4. Flowchart operations that take place within the controller 100 are included within a heavy solid box 102. In the second mode, the external controller adjustably provides parameters to the microprocessor 130 through the external controller connection 136, such as desired signal output level "$P_{out}$", in decibels (dB), and the value of a dimensionless feedback loop damping parameter "x". The controller 100 accepts the tapped, amplified output light signal from the output photodetector 22. The tapped, amplified output signal is converted to an electronic signal $P_{PD}$ and transmitted to the second log amp 120. The electronic output signal $P_{PD}$ is transmitted to the microprocessor 130 without being converted to a logarithmic value.

The microprocessor 130 takes the ratio of $P_{out}/P_{PD}$ and, since one percent, or $1/100^{th}$ of the output signal was tapped, compares the ratio of $P_{out}/P_{PD}$ to 100±a predetermined delta δ. If $P_{out}/P_{PD}$ is within the range of 100 ±δ, then no adjustments are required. If, however, $P_{out}/P_{PD}$ is above the range of 100±δ, then the microprocessor 130 sends a signal through the pump laser diode input connections 144, 146 to the pump laser controller 140 to increase current to the pump laser diode by $(P_{out}-100*P_{PD})\times/P_{out}$. An increase in current to the pump laser diode will increase amplification of the signal light, thus decreasing the value of the output (100$P_{PD}$). If $P_{out}/P_{PD}$ is below the range of 100±δ, then the microprocessor 130 sends a signal through the pump laser diode input connections 144, 146 to the pump laser controller 140 to decrease current to the pump laser diode by $(100*P_{PD}-P_{out})\times/P_{out}$. A decrease in current to the pump laser diode will decrease amplification of the signal light, thus decreasing the value of the output (100$P_{PD}$).

The controller 100 is part of a feedback loop within the optical amplifier to receive and process the electronic output signal $P_{PD}$ to control the desired signal output level $P_{out}$. The ratio of the desired signal output level $P_{PD}$ to the electronic output signal $P_{PD}$ is processed by the microprocessor 150 periodically, preferably between a range of approximately 0.1 milliseconds to 100 milliseconds.

In both the first and second modes, the temperature sensor 150 receives temperature data from the thermistor on the pump laser trough the thermistor connections 152, 154. The temperature sensor 150 sends a signal to the microprocessor 130 through the temperature sensor connection 159. The microprocessor 130 processes the signal received from the temperature sensor 150 and transmits a TEC controller signal to the TEC controller 160 through the TEC controller connection 162. The TEC controller 160 transmits a signal to the TEC on the pump laser to adjust the temperature of the pump laser.

It will be appreciated by those skilled in the art that changes could be made to the embodiment described above without departing from the broad inventive concept thereof. It is understood, therefore, that this invention is not limited to the particular embodiment disclosed, but it is intended to cover modifications within the spirit and scope of the present invention as defined by the appended claims.

What is claimed is:

1. A dual mode electronic amplifier controller comprising:
   a first amplifier electronically connectable to an optical input signal, the first amplifier having a first output;
   a second amplifier electronically connectable to an optical output signal, the second amplifier having a second output; and
   a microprocessor electronically connected to the first and second outputs, the microprocessor being adapted to operate in one of a first mode wherein the microprocessor compares functions of the first and second outputs and generates a first microprocessor output, and a second mode wherein the microprocessor compares the second output to a predetermined value and generates a second microprocessor output, such that, in either the first or second modes, each of the first and second microprocessor outputs is adapted to adjust electrical current to a laser.

2. The dual mode electronic amplifier controller according to claim 1, wherein each of the first and second microprocessor outputs is adapted to adjust the electrical current to the laser by a predetermined amount.

3. The dual mode electronic amplifier controller according to claim 2, wherein the predetermined amount is adjustable.

4. The dual mode electronic amplifier controller according to claim 1, wherein the microprocessor is adapted to receive an input for a signal gain level from a remote source.

5. The dual mode electronic amplifier controller according to claim 4, wherein the microprocessor is adapted to compare the difference of a function of the values of the first and second outputs to the signal gain level.

6. The dual mode electronic amplifier controller according to claim 5, wherein the function is a logarithmic function.

7. The dual mode electronic amplifier controller according to claim 1, wherein the microprocessor is adapted to receive an input for an output power level from a remote source.

8. The dual mode electronic amplifier controller according to claim 7, wherein the microprocessor is adapted to compare the second output to the output power level.

9. The dual mode electronic amplifier controller according to claim 1, further comprising a communications port electronically connected to the microprocessor, the communications port being adapted to receive control signals from a remote source.

10. The dual mode electronic amplifier controller according to claim 1, further comprising a temperature sensor electronically connected to the microprocessor, the temperature sensor being adapted to receive an electronic signal from a remote source.

11. The dual mode electronic amplifier controller according to claim 1, wherein the microprocessor is adapted to alternate between the first mode and the second mode.

12. The dual mode electronic amplifier controller according to claim 1, wherein each of the first and second logarithmic amplifiers has a dynamic range between 50 and 100 dB.

13. The dual mode electronic amplifier controller according to claim 1, further comprising a temperature sensor and a thermoelectric cooler controller each electronically connected to the microprocessor, the temperature sensor and the thermoelectric cooler controller being adapted to control the temperature of a laser.

14. The dual mode electronic amplifier controller according to claim 1, wherein the temperature sensor and the thermoelectric cooler being adapted to control the temperature of a laser via a feedback loop.

15. The dual mode electronic amplifier controller according to claim 1, wherein the controller has approximate dimensions of 6.1 mm×11.3 mm.

* * * * *